(12) United States Patent
Samuels

(10) Patent No.: US 11,972,926 B2
(45) Date of Patent: Apr. 30, 2024

(54) DYNAMIC CONTROL-SETPOINT MODIFICATION

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1 day.

(21) Appl. No.: 17/494,383

(22) Filed: Oct. 5, 2021

(65) Prior Publication Data

US 2023/0106863 A1 Apr. 6, 2023

(51) Int. Cl.
*H01J 37/32* (2006.01)
*G05B 15/02* (2006.01)

(52) U.S. Cl.
CPC ........ *H01J 37/32174* (2013.01); *G05B 15/02* (2013.01); *H01J 2237/332* (2013.01)

(58) Field of Classification Search
USPC ........................................... 700/287, 44, 45
See application file for complete search history.

(56) References Cited

U.S. PATENT DOCUMENTS

| | | | |
|---|---|---|---|
| 8,040,068 B2 | 10/2011 | Coumou | |
| 8,258,874 B2 | 9/2012 | van Zyl | |
| 8,716,984 B2 | 5/2014 | Mueller | |
| 8,912,835 B2 | 12/2014 | Nagarkatti | |
| 9,225,299 B2 | 12/2015 | van Zyl | |
| 9,721,758 B2 | 8/2017 | Coumou | |
| 10,049,857 B2 | 8/2018 | Fisk, II | |
| 2008/0179948 A1 | 7/2008 | Nagarkatti et al. | |
| 2008/0195236 A1 | 8/2008 | Koo et al. | |
| 2009/0278598 A1* | 11/2009 | van Zyl | H03H 7/40 330/110 |
| 2014/0210551 A1 | 7/2014 | Mueller | |
| 2015/0270104 A1* | 9/2015 | Van Zyl | H01J 37/32146 315/111.21 |

OTHER PUBLICATIONS

Vora, "Control Design for Generator of Nonlinear High Frequency Plasma System" Master of Science Thesis, Colorado State University, Summer 2021 (date available: Sep. 6, 2021), 80 Pgs. (Year: 2021).* mountainscholar.org, Advanced record for thesis titled "Control design for generator of nonlinear high frequency plasma system" accessed at https://mountainscholar.org/handle/10217/233713?show=full and at https://mountainscholar.org/ on Mar. 23, 2023, 5 page printout (Year: 2023).*

ISA, "International Search Report and Written Opinion Regarding Application No. PCT/US2022/045301", Feb. 15, 2023, p. 8, Published in: US.

* cited by examiner

*Primary Examiner* — Emilio J Saavedra
(74) *Attorney, Agent, or Firm* — Neugeboren O'Dowd PC

(57) ABSTRACT

A generator and a method for controlling the generator are disclosed. The method comprises receiving a power sequence comprising a plurality of power states, creating a dynamic reference-time response within each state, and determining a dynamic average-delivered-power value within each state. An error signal is calculated within each state, and a controller output is produced using the error signal. An internal setpoint is produced based upon the error signal, and a power amplifier is controlled using the internal setpoint to control output power.

16 Claims, 7 Drawing Sheets

DYNAMIC CONTROL-SETPOINT MODIFICATION

BACKGROUND

Field

Aspects of the present disclosure relate generally to control systems, including control systems for radio frequency (RF) generators.

Background

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma applications.

After substantial technological progress, one typical plasma power and control system may comprise a plasma reactor, powered by a power generator connected through an impedance match network, and accompanied by measurement equipment that detects signals and physical states from the match network and the plasma reactor and feeds that data to the power generator.

In some plasma processing recipes, it is desirable to provide a pulsed waveform having multiple states (or power levels). Each recipe includes a number of pulse cycles (PC), number of pulses per pulse cycle, and a number of states per pulse. Each state has a different target power level.

A typical system has a drawback that Phase/Rail/Drive control is based on an integral control mechanism, where a last control value for a state is remembered and used as a starting value for the next time that state is entered. This mechanism is adequate when driving a linear load, but with plasmas, which are highly non-linear loads, the reset mechanism is a source of chaos, instability, and bifurcation because during the time between memorizing the state value and recalling the state value, the load condition might change. And because the plasma is chaotic, very different responses than from what are expected are prone to occur. For example, unexpectedly high overshoot, instability, and/or a triggering of clamping/protection mechanisms may occur.

As a consequence, improved control approaches that lead to more repeatable and predictable results are desired.

SUMMARY

An aspect may be characterized as a generator comprising a power amplifier configured to apply output power to a load responsive to an internal power setpoint and a metrology component configured to produce a dynamic average-delivered-power value based upon instantaneous measurements of the output power. A dynamic setpoint module is configured to receive a setpoint value for each of a plurality of power states, and within each of the power states, create a dynamic reference-time response and compute an error value based upon a difference between the dynamic reference-time response and the dynamic average-delivered-power value. In addition, the dynamic setpoint module is configured to produce a controller output value based upon the error value and produce the internal power setpoint by adding the controller output value and the setpoint value.

Another aspect may be characterized as a method for controlling a generator comprising: receiving a power sequence comprising a plurality of power states, creating a dynamic reference-time response within each state, and determining a dynamic average-delivered-power value within each state. In addition, an error signal is calculated within each state and a controller output is produced using the error signal. An internal setpoint is also calculated based upon the error signal and a power amplifier is controlled using the internal setpoint to control output power.

Yet another aspect may be characterized as a non-transitory, tangible computer readable storage medium, encoded with processor readable instructions to control a generator. The instructions comprise instructions to receive a power sequence comprising a plurality of power states. A dynamic reference-time response is created within each state, a dynamic average-delivered-power value is determined within each state, and an error signal is calculated within each state. A controller output is produced using the error signal, an internal setpoint is calculated based upon the error signal, and a power amplifier is controlled using the internal setpoint to control output power.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1A:
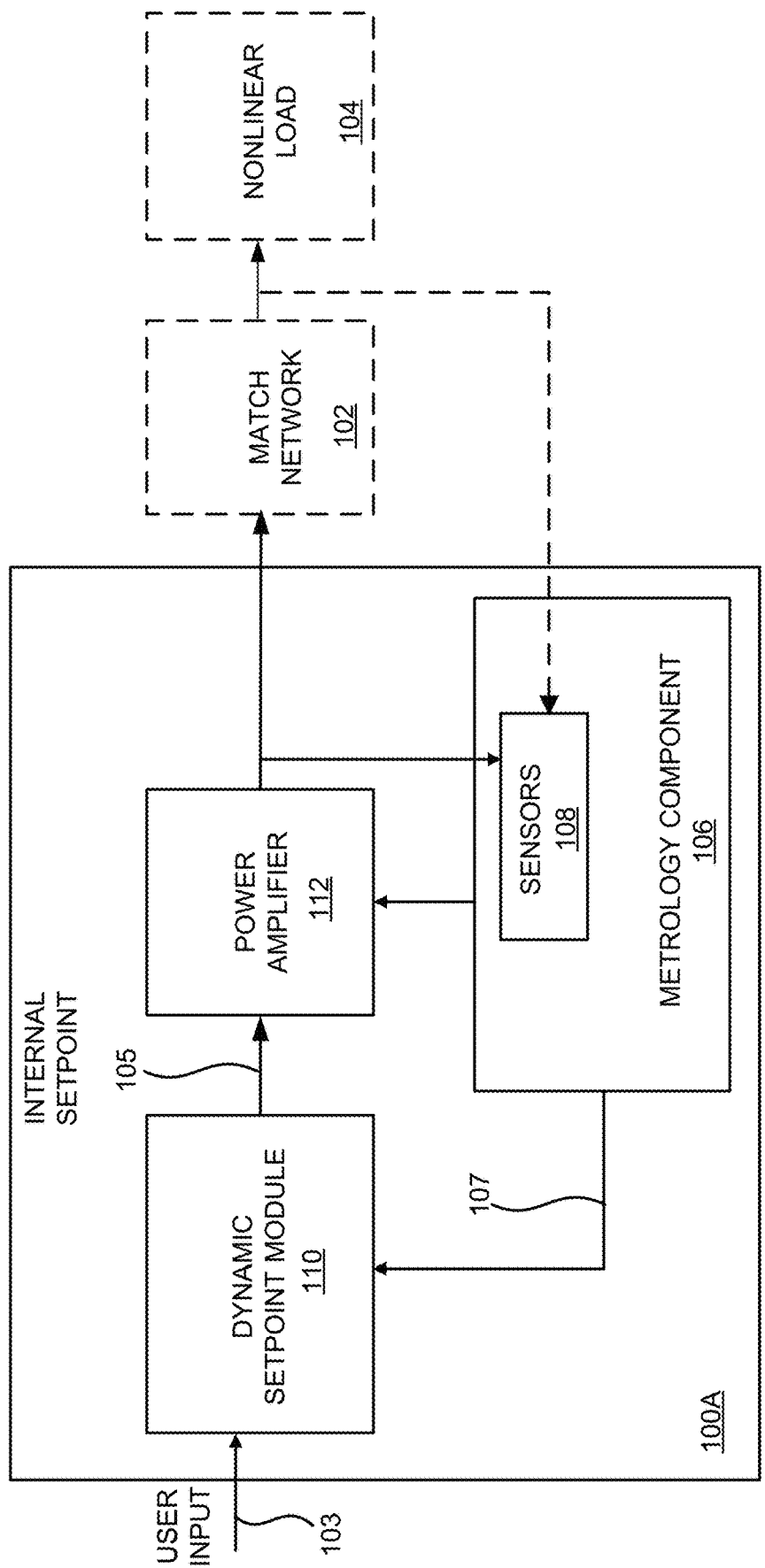
FIG. 1A is a block diagram depicting aspects of a power generator.
Figure 1B:
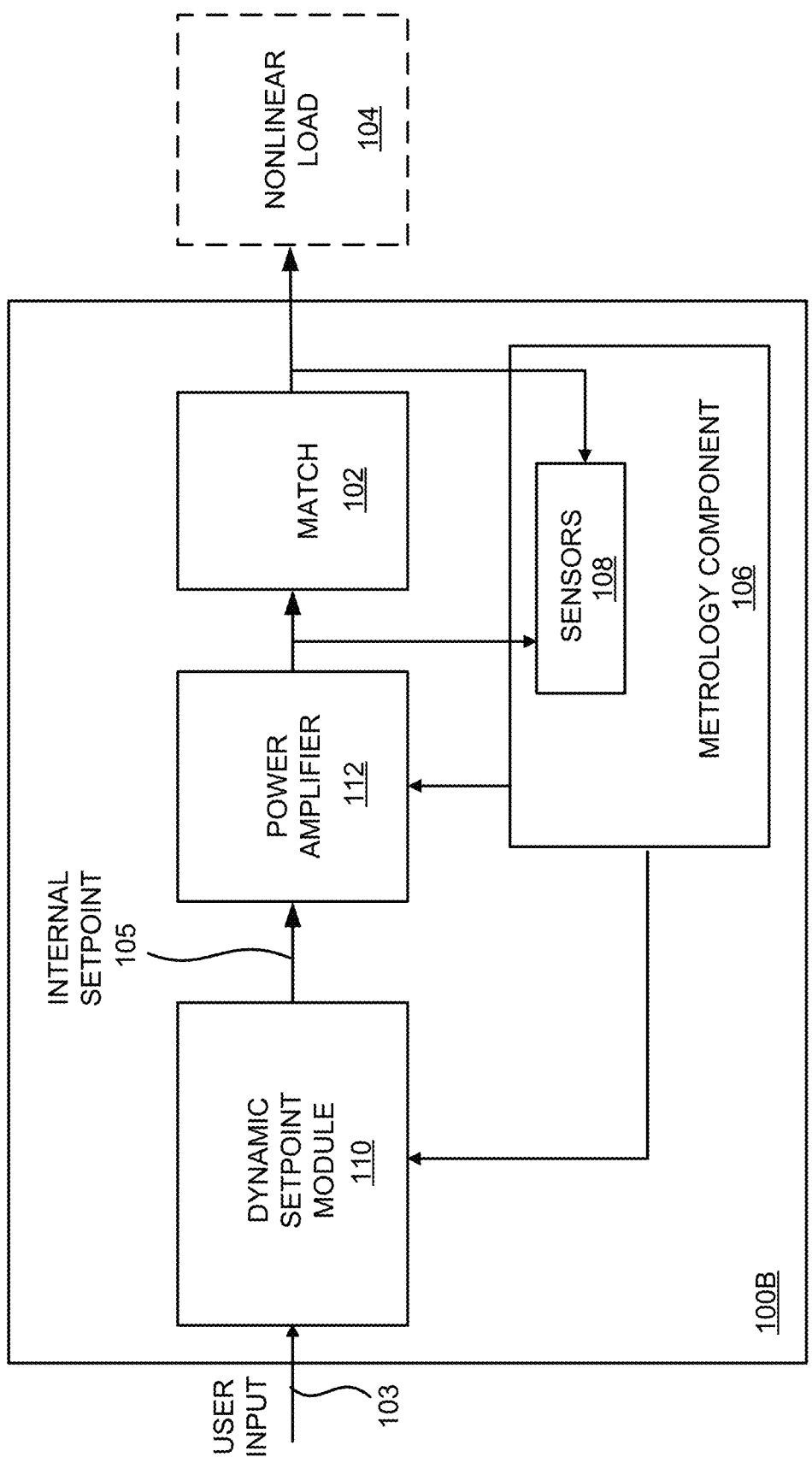
FIG. 1B is a block diagram depicting aspects of another power generator.

Referring to FIGS. 1A and 1B, shown are block diagrams depicting exemplary generators 100A, 100B. As shown, each of the generators 100A, 100B is coupled indirectly, via a match network 102, to a non-linear load 104. In FIG. 1A, the match network 102 is a separate device outside of a housing of the generator 100A and in FIG. 1B, the generator 100B comprises the match network 102 within the housing of the generator 100A. Although not depicted, it is also contemplated that the generator 100A may be directly coupled to the nonlinear load 104 without the match network 102 interposed therebetween. As shown, the generator 100A, 100B comprises a dynamic setpoint module 110 that is coupled to a power amplifier 112, and the power amplifier 112 applies power to the nonlinear load 104 either directly or through the match network 102. Also shown is a metrology component 106 that is coupled to sensors 108, the dynamic setpoint module 110, and the power amplifier 112. As depicted, the dynamic setpoint module 110 is positioned and configured to receive one or more user inputs 103, and in response to the one or more user inputs 103 and a processed signal 107, the dynamic setpoint module 110 provides a dynamic internal setpoint 105 to control the power amplifier 112. Before detailing several inventive aspects of the dynamic setpoint module 110, other aspects of the generator 100A, 100B, the match network 102 and the nonlinear load 105 are briefly discussed.

In general, whether residing within a housing of the generator 100A or outside the housing of the generator 100B, the match network 102 functions to transform an impedance at the output of the match network 102 to an impedance, Zp, that is presented to a transmission line at an input of the match network 102. More specifically, within the match network 102, a variable reactance functions to transform the impedance at the output of the match network 102 to an input-impedance that is presented to the transmission line at the input (generator 100A, 100B side) of the match network 102.

In many embodiments for example, the nonlinear load 104 may be a plasma load contained within a plasma processing chamber, and the generators 100A, 100B may function to ignite and sustain the plasma within the plasma processing chamber. In these embodiments, the match network 102 may be employed to ensure the generator 102 sees a desired impedance (typically, although not always, 50 ohms) at the output of the generator 100A, 100B.

Figure 2:
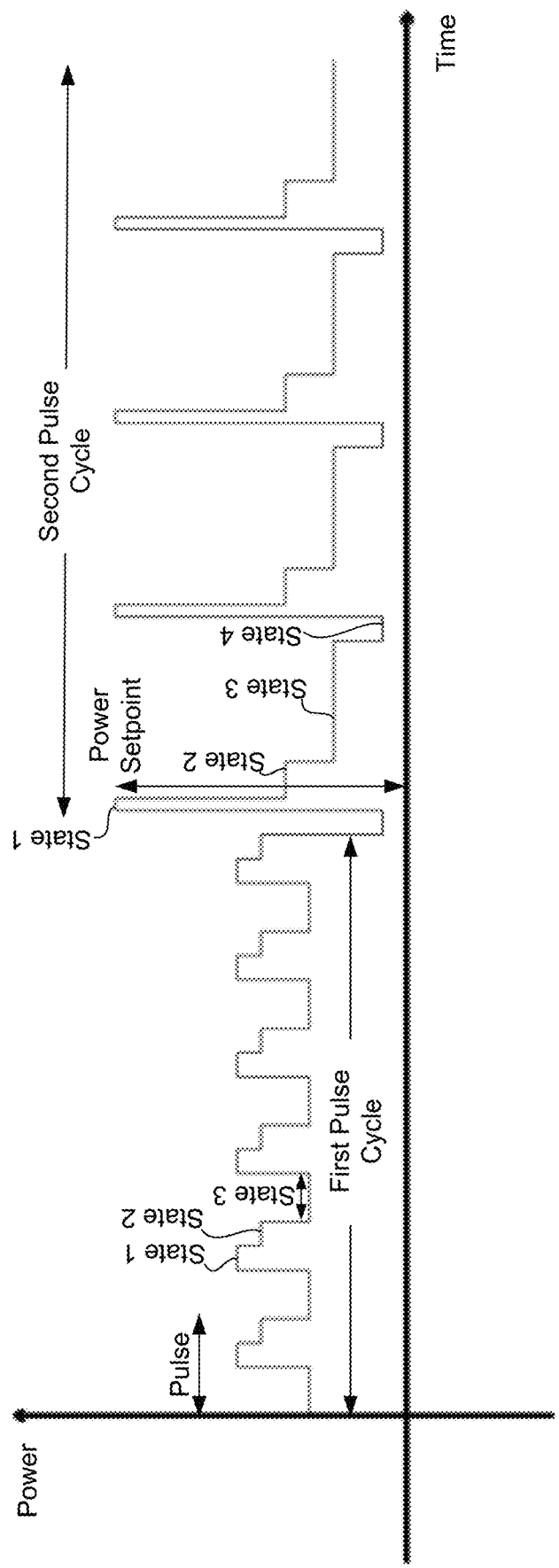
FIG. 2 is an example of a multi-level pulsed waveform that may be produced by the generators disclosed herein.

In these plasma-processing embodiments, as discussed further herein, the generators 100A, 100B may apply pulsed power in connection with recipes as a pulsed waveform having multiple states (or power levels), as exemplified by the illustrative waveform in FIG. 2, to the plasma processing chamber in connection with plasma processing carried out within the plasma processing chamber.

As shown in FIG. 2, each recipe may comprise a number of pulse cycles (PC), a number of pulses per pulse cycle, and a number of states per pulse. Each state has a different target power level. In this example, two pulse cycles are shown where the first pulse cycle has six pulses and each of those pulses has three states. The second pulse cycle has four pulses and each of the four pulses has four states. Although not shown in FIG. 2, when applied to the nonlinear load 104, within the pulsing envelopes, the generators 100A, 100B may be configured to apply a periodic (e.g., sinusoidal) radio frequency voltage waveform such as, for example, without limitation, 13.56 MHz, 60 MHz, or another frequency.

Referring again to FIGS. 1A and 1B, the metrology component 106 generally functions to measure one or more power-related parameters. As those of ordinary skill in the art will readily appreciate, the metrology component 106 may include one or more sensors 108 that produce signals that are indicative of electrical parameter values at one or more locations of the generator 100A. 100B. The metrology component 106 may also include inputs to receive signals from sensors that are external to the generator 100A, 100B. For simplicity, the sensors 108 are depicted as a block within the metrology component 106, but this is a functional depiction to illustrate the sensors 108 are a part of the functionality of the metrology component 106. In implementation, the sensors 108 may be distributed throughout the generator 100A, 100B, and external sensors may also be coupled to the output of the match network 102 and/or coupled to the nonlinear load 104. It is also contemplated that the metrology component 106 may be distributed among several pieces of hardware, which may be within and/or outside of a housing of the generator 100A, 100B.

In operation, the metrology component 106 may provide one or more processed signals 107 to a dynamic setpoint module 110 and the power amplifier 112. Although not shown, the metrology component 106 may also control a variable reactance section of the match network 102 so the input impedance of the match network 104 is close to a desired input impedance (e.g., close to 50 ohms).

The sensors 108 may include conventional dual directional couplers (known to those of ordinary skill in the art) that include sensing circuitry that provides outputs indicative of forward and reflected power. It is also contemplated that the sensors 108 may include conventional voltage-current (V/I) sensors (known to those of ordinary skill in the art) that include sensing circuitry that provides outputs indicative of voltage, current, and a phase between the voltage and current.

The metrology component 106 may also include processing components to sample, filter, and digitize the outputs of the sensors 108 for utilization by the dynamic setpoint module 110 and the power amplifier 112. Although not required, processing components of the metrology component 106 may be realized by a field programmable gate array that is configured to sample and process the signals from the sensors 108.

Figure 3:
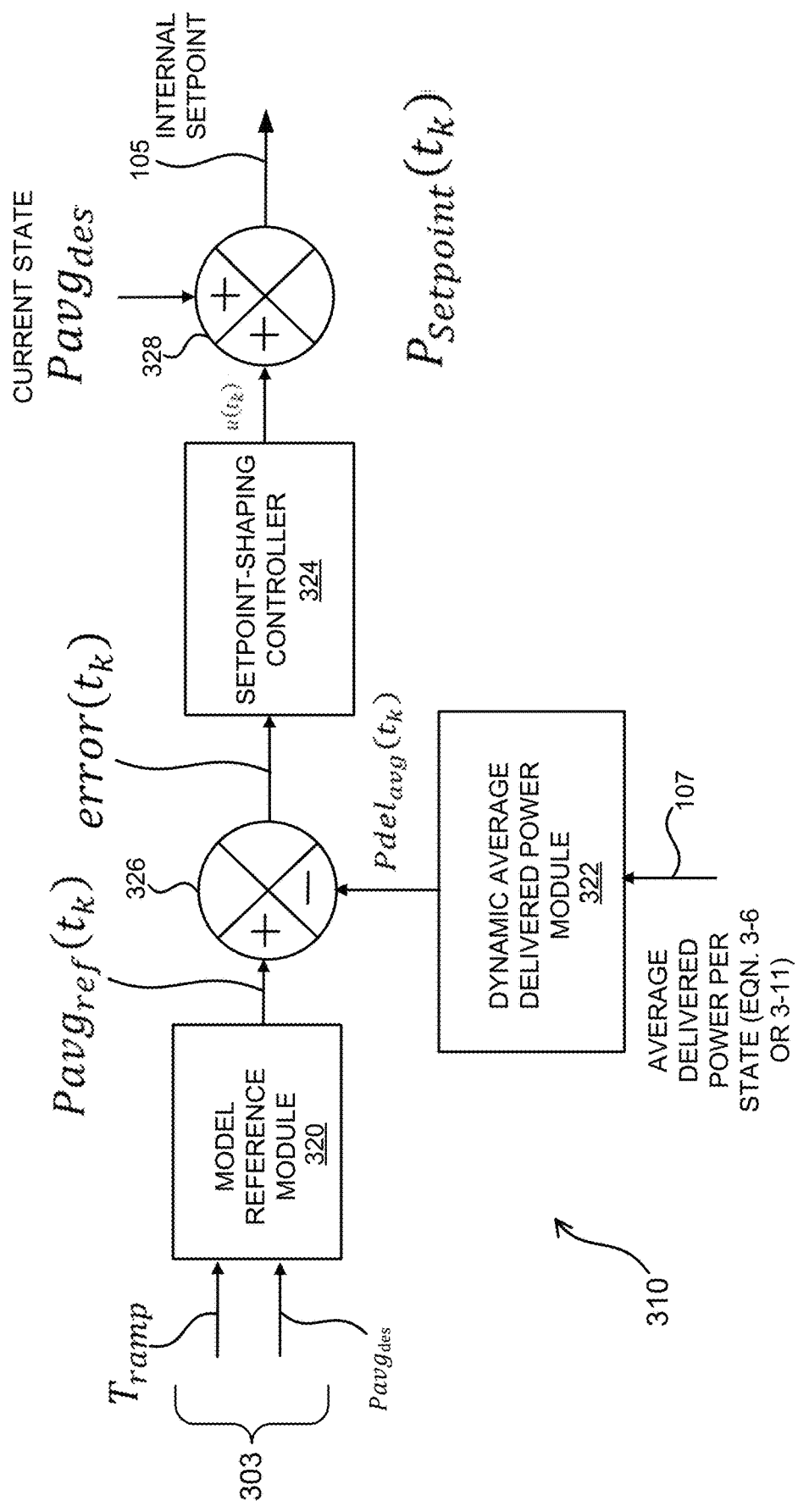
FIG. 3 is a block diagram depicting aspects of the dynamic setpoint module depicted in FIG. 1.
Figure 4:
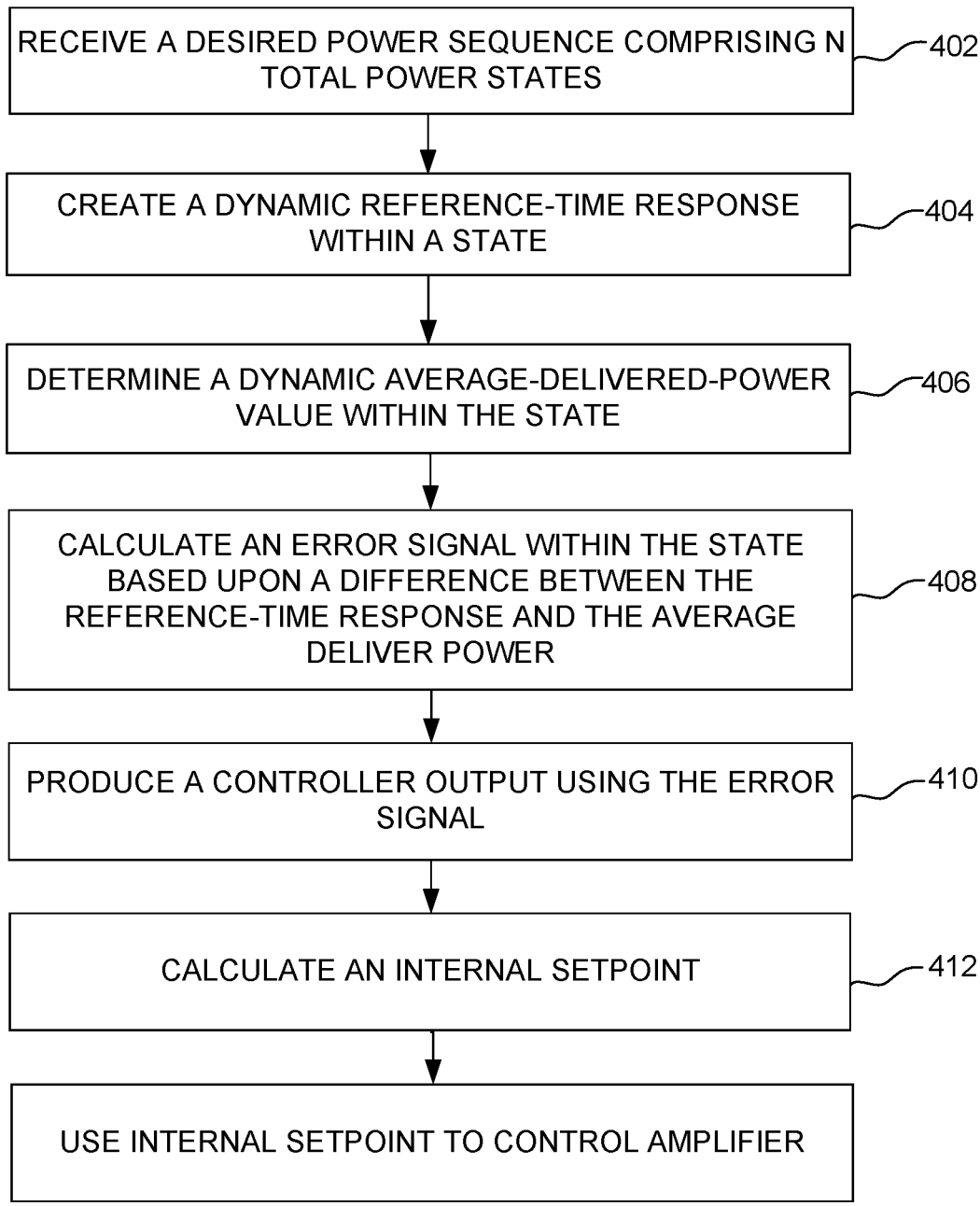
FIG. 4 is a flowchart depicting operational aspects of embodiments disclosed herein.

Referring next to FIG. 3, shown is a block diagram depicting an example dynamic setpoint module 310 that may be used to realize the dynamic setpoint module 110 depicted in FIG. 1. While referring to FIG. 3, simultaneous reference is made to FIG. 4, which is a flowchart depicting a method that may be traversed in connection with embodiments disclosed herein. As shown, the dynamic setpoint module 310 comprises a model reference module 320, a dynamic average delivered power module 322, and a setpoint-shaping controller 324. As shown, the model reference module 320 is configured to receive user inputs 303 defining a desired power sequence comprising N power states (Block 402). For example, for each of the N states, a user may provide a desired average power value, $Pavg_{des}$, along with a value, $T_{ramp}$, that defines a time it takes a certain power state to go from 0 to $Pavg_{des}$.

Figure 5:
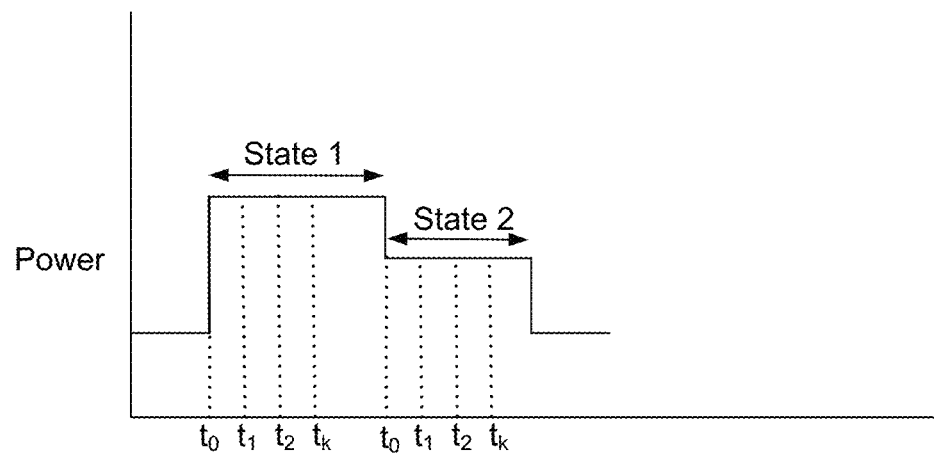
FIG. 5 is an example of samples within a multi-level pulsed waveform.

For each power state, the model reference module 320 produces, for each sample at a time $t_k$ within a state, a dynamic reference-time response: $Pavg_{ref}(t_k)$(Block 404). Referring to FIG. 5, shown is an example of two power state and associated times $t_k$. As shown, the beginning of each state corresponds to a time to and k is successively incremented for each sample within a particular state.

In some implementations, the dynamic reference-time response may be established as a reference critically damped time response defined by:

$$Pavg_{ref}(t_k) = \begin{cases} Pavg_{des} * \left(1 - e^{\frac{-t_k}{SLTS}}\right), & T_{ramp} \in \{\emptyset\} \\ \min_{\forall t_k}\left\{Pavg_{des}, \frac{Pavg_{des}}{T_{ramp}} * t_k\right\}, & T_{ramp} \notin \{\emptyset\} \end{cases} \quad \text{Eqn. (1)}$$

As Equation 1 conveys, the reference-time response may dynamically vary within each state. But it should be recognized that Equation 1 is merely an example and that the reference-time response may be defined by alternative functions.

Within each power state, the dynamic average delivered power module 322 dynamically calculates a dynamic average-delivered-power value, Pdelavg($t_k$), at each time, $t_k$ (Block 406). As discussed below, the dynamic average-delivered-power value, Pdelavg($t_k$) may be calculated in alternative ways depending upon a duty cycle or pulse repetition rate.

As shown, a difference module 326 calculates an error signal, error($t_k$), based upon a difference between the dynamic reference-time response and the corresponding average delivered power at the time $t_k$: error($t_k$)=Pavg$_{ref}$($t_k$)−Pdel$_{avg}$($t_k$)(Block 408).

In addition, the setpoint-shaping controller 324 produces an output signal, u($t_k$), based upon the error signal (Block 410). An exemplary setpoint-shaping controller 324 is realized as a proportional-integral-derivative (PID) controller where gains for all states are set to unity, which may be defined as:

$$u(t_k) = K_P * \text{error}(t_k) + K_D * (\text{error}(t_k) - \text{error}(t_{k-1})) + K_I * \Sigma_{i=1}^{k} \text{error}(t_i).$$

As those of ordinary skill in the art will appreciate in view of this disclosure, the coefficients $K_P$, $H_D$, and $K_I$ may be set to values based upon desired control attributes. Although not required, the coefficients may be set to meet the criteria of an $\mathcal{H}_\infty$ robust controller. It should be recognized that the above-described PID controller is only an example and that other types of controllers may be utilized.

As shown, a summation module 328 then produces the internal setpoint 105 based upon the desired average power Pavg$_{des}$ for the power state and the controller output, u($t_k$): P$_{Setpoint}$($t_k$)=Pavg$_{des}$+u($t_k$)(Block 412). Thus, the internal setpoint 105 is dynamic by virtue of the dynamic nature of the calculation of Pavg$_{des}$ and the calculation of u($t_k$). As discussed above, the calculation used to produce Pdelavg($t_k$) may depend upon a duty cycle or pulse repetition period (PRP) of the pulses.

Calculation of Average Delivered Power During Low Duty Cycle

In some implementations, the dynamic average delivered power module 322 is realized by an FPGA while other components of the dynamic setpoint module 310 (such as the model reference module 320 and the setpoint-shaping controller 324) are realized by software (e.g., a CPU in connection with processor executable instructions). In these implementations, there may be relatively long response times to power states with low duty-cycles, which are dependent on having a very long PRP (e.g., in the order of a software loop interrupt period) or more. The shorter the PRP value, the easier it is for the system to overcome the low duty cycle issue. This happens because shorter PRP values lead the FPGA to be filled out with instantaneous power measurements at a rate that is faster than the software loop's interrupt period. As a consequence, the smaller the PRP, the more samples that averaging filters (of the dynamic average delivered power module 322) will have before an average is requested by the software loop. So, one approach to calculating Pdelavg($t_k$) overcomes these discovered low duty cycle problems. It should be noted that whenever the user changes anything in the desired power sequence, the algorithm may be reset to its initial condition.

A value for bandwidth, BW, is initially set. An optimum (as determined through a worst-case scenario simulation analysis) value corresponds to:

$$BW = \frac{1}{SLTS}/i. \quad \text{(Eqn. 2)}$$

Where SLTS is a software loop sampling time and i is a value that may be empirically determined. For example, i may be set to a largest value possible that does not cause aliasing. In this method, a determination of a number of instantaneous power samples that are needed to fill out this filter is made:

$$\text{Counter}_{MAX} = \left\lceil \frac{1}{BW} * \frac{1}{FPGATS} \right\rceil \quad \text{(Eqn. 3)}$$

where $\lceil x \rceil$ is the ceiling function of x and FPGATS is the FPGA sampling time. For example, but without limitation, the software loop sampling time may be a few milliseconds and the FPGA sampling time may be tens of nanoseconds.

In addition, a number of averaging-blank-out samples to be used at the start of each state during each power cycle may be determined:

$$\text{Counter}_{BlankoutMAX} = \left\lfloor \frac{MaskTime}{FPGATS} \right\rfloor \quad \text{(Eqn. 4)}$$

where $\lceil x \rceil$ is the floor function of x.

For each state M two counters may be created:

A first counter, counter$_{Blankout}$($t_k$), is created that initializes to 1 at the triggering edge of every occurrence of state M. This counter is incremented at each received sample of instantaneous power measurements at a rate of FPGATS and saturates at a value of $$\text{Counter}_{BlankoutMAX}(t_k) = \begin{cases} \text{Counter}_{Blankout}(t_{k-1}) + 1, & \text{Counter}_{Blankout}(t_{k-1}) \leq \text{Counter}_{BlankoutMAX} \\ \text{Counter}_{BlankoutMAX} + 1, & \text{Counter}_{Blankout}(t_{k-1}) > \text{Counter}_{BlankoutMAX} \end{cases} \quad \text{(Eqn. 5)}$$

The purpose of this first counter is to determine whether the average value reported for the current state should be the blank-out value or the value computed based on the current instantaneous power measurement value.

A second counter, Counter($t_k$), may also be initialized to 1 at the first triggering edge of power state M. This counter is incremented at each received sample of instantaneous power measurements at a rate of FPGATS and saturates at a value of Counter$_{MAX}$. It stops incrementing when the power state switches to another state and resumes when the state M is re-entered.

$$\text{Counter}(t_k) = \quad \text{Eqn. 6)}$$

$$\begin{cases} \text{Counter}_{Blankout}(t_{k-1}), & \text{Counter}_{Blankout}(t_{k-1}) \leq \text{Counter}_{BlankoutMAX} \\ \text{Counter}_{Blankout}(t_{k-1}) + 1, & \text{Counter}_{Blankout}(t_{k-1}) > \text{Counter}_{BlankoutMAX} \text{ AND } \text{Counter}(t_{k-1}) \leq \text{Counter}_{MAX} \\ \text{Counter}_{MAX} + 1, & \text{Counter}_{Blankout}(t_{k-1}) > \text{Counter}_{BlankoutMAX} \text{ AND } \text{Counter}(t_{k-1}) > \text{Counter}_{MAX} \end{cases}$$

The purpose of this second counter is to allow the proper carrying of the averaging operations.

For every received sample of the instantaneous power measurements (at a rate of FPGATS) the following operations are carried out: determining which state the generator is currently in; computing $\text{Counter}_{Blankout}(t_k)$ using Equation 5; and compute $\text{Counter}(t_k)$ using Equation 6. If $\text{Counter}_{Blankout}(t_k) \leq \text{Counter}_{BlankoutMAX}$, then the average reported power corresponds to the last value of the average delivered power of the current power state. But if $\text{Counter}_{Blankout}(t_k) > \text{Counter}_{BlankoutMAX}$ then the average reported power corresponds to the average power computed through Equation 7, where $Pdel(t_k)$ is the current instantaneous power measurement:

$$Pdel_{avg}(t_k) = \frac{Pdel_{avg}(t_{k-1}) * \text{Counter}(t_{k-1}) + Pdel(t_k)}{\text{Counter}(t_k)} \quad \text{(Eqn. 7)}$$

Calculation of Average Delivered Power During High Duty Cycle

In the case of a small pulse repetition period (PRP), at each software interrupt (i.e., SLTS) the system has processed multiple PRPs. Moreover, using the filter described above with reference to Equation 2 through Equation 7 in connection with a high duty cycle would not be optimal. This is because the information contained in the PRP Average is more recent and complete than the information contained in the filter of above. As a consequence, using the PRP average makes the system responsiveness faster and more accurate without affecting the robustness and stability of the response.

So, to optimize the filter described above (with reference to Equations 2 through 7), a special case may be taken into consideration. More specifically, the average power delivered value used in the software loop corresponds to the PRP average. The PRP average may be computed through the following algorithm (e.g., if SLTS≥2*PRP) while recognizing that whenever the user changes anything in the desired power sequence the algorithm may be reset to its initial condition:

1) Determine the averaging blank-out samples to be used at the start of each state during each power cycle as:

$$\text{Counter}_{BlankoutMAX} = \left\lfloor \frac{MaskTime}{FPGATS} \right\rfloor \quad \text{(Eqn. 8)}$$

Where $\lfloor x \rfloor$ is the floor function of x and FPGATS is the FPGA sampling time.

2) For each state:
   Where, for state M:
   i. Create a blank-out counter that initializes to 1 at the triggering edge of every occurrence of state M. This counter is incremented at each received sample of instantaneous power measurements at a rate of FPGATS and saturates at a value of $\text{Counter}_{BlankoutMAX}$.

$$\text{Counter}_{Blankout}(t_k) = \quad \text{(Eqn. 9)}$$

$$\begin{cases} \text{Counter}_{Blankout}(t_{k-1}) + 1, & \text{Counter}_{Blankout}(t_{k-1}) \leq \text{Counter}_{BlankoutMAX} \\ \text{Counter}_{BlankoutMAX} + 1, & \text{Counter}_{Blankout}(t_{k-1}) > \text{Counter}_{BlankoutMAX} \end{cases}$$

The purpose of this counter is to determine whether the average value reported for the current state should be the blank-out value or the value computed based on the current instantaneous power measurement value.

ii. Create another counter that initializes to 1 at the first triggering edge of state M. This counter is incremented at each received sample of instantaneous power measurements at a rate of FPGATS. It stops incrementing when the power state switches to another state. When state M is re-entered, and the blank-out time is exhausted, the counter restarts counting from 1.

$$\text{Counter}(t_k) = \quad \text{(Eqn 10)}$$

$$\begin{cases} \text{Counter}(t_{k-1}), & \text{Counter}_{Blankout}(t_{k-1}) < \text{Counter}_{BlankoutMAX} \\ 1, & \text{Counter}_{Blankout}(t_{k-1}) = \text{Counter}_{BlankoutMAX} \\ \text{Counter}(t_{k-1}) + 1, & \text{Counter}_{Blankout}(t_{k-1}) > \text{Counter}_{BlankoutMAX} \end{cases}$$

The purpose of this counter is to allow the proper carrying of the averaging operations.

iii. Create a sum that initializes to 0 at the first triggering edge of state M. This sum is incremented by $Pdel(t_k)$ at each received sample of instantaneous power measurements at a rate of FPGATS. It stops incrementing when the power state switches to another state. When state M is re-entered, and the blank-out time is exhausted, the sum restarts from the current value of $Pdel(t_k)$. Where $Pdel(t_k)$ is the current instantaneous power measurement.

$$Pdel_{Sum}(t_k) = \begin{cases} Pdel_{Sum}(t_{k-1}), & \text{Counter}_{Blankout}(t_{k-1}) < \text{Counter}_{BlankoutMAX} \\ Pdel(t_k), & \text{Counter}_{Blankout}(t_{k-1}) = \text{Counter}_{BlankoutMAX} \\ Pdel_{Sum}(t_{k-1}) + Pdel(t_k), & \text{Counter}_{Blankout}(t_{k-1}) > \text{Counter}_{BlankoutMAX} \end{cases} \quad \text{(Eqn. 11)}$$

The purpose of this sum is to allow the proper carrying of the averaging operations.

3) For every received sample of the instantaneous power measurements (at a rate of FPGATS) the following operations may be carried out: a determination of the current state; computing $\text{Counter}_{Blankout}(t_k)$ using Equation 9; computing $\text{Counter}(t_k)$ using Equation 10; and computing $Pdel_{Sum}(t_k)$ using Equation 11. The average reported power corresponds to the average power computed through Equation 12:

$$Pdel_{avg}(t_k) = \frac{Pdel_{Sum}(t_k)}{\text{Counter}(t_k)} \quad \text{(Eqn. 12)}$$

Equations 7 and 12 are alternative equations that may be used to determine the average power. As one of ordinary skill in the art will appreciate, Equations 7 and 12 provide a dynamic measure of average power within each power state. But it should be recognized that other alternative approaches to dynamically calculating average power within each power state may be utilized.

Figure 6:
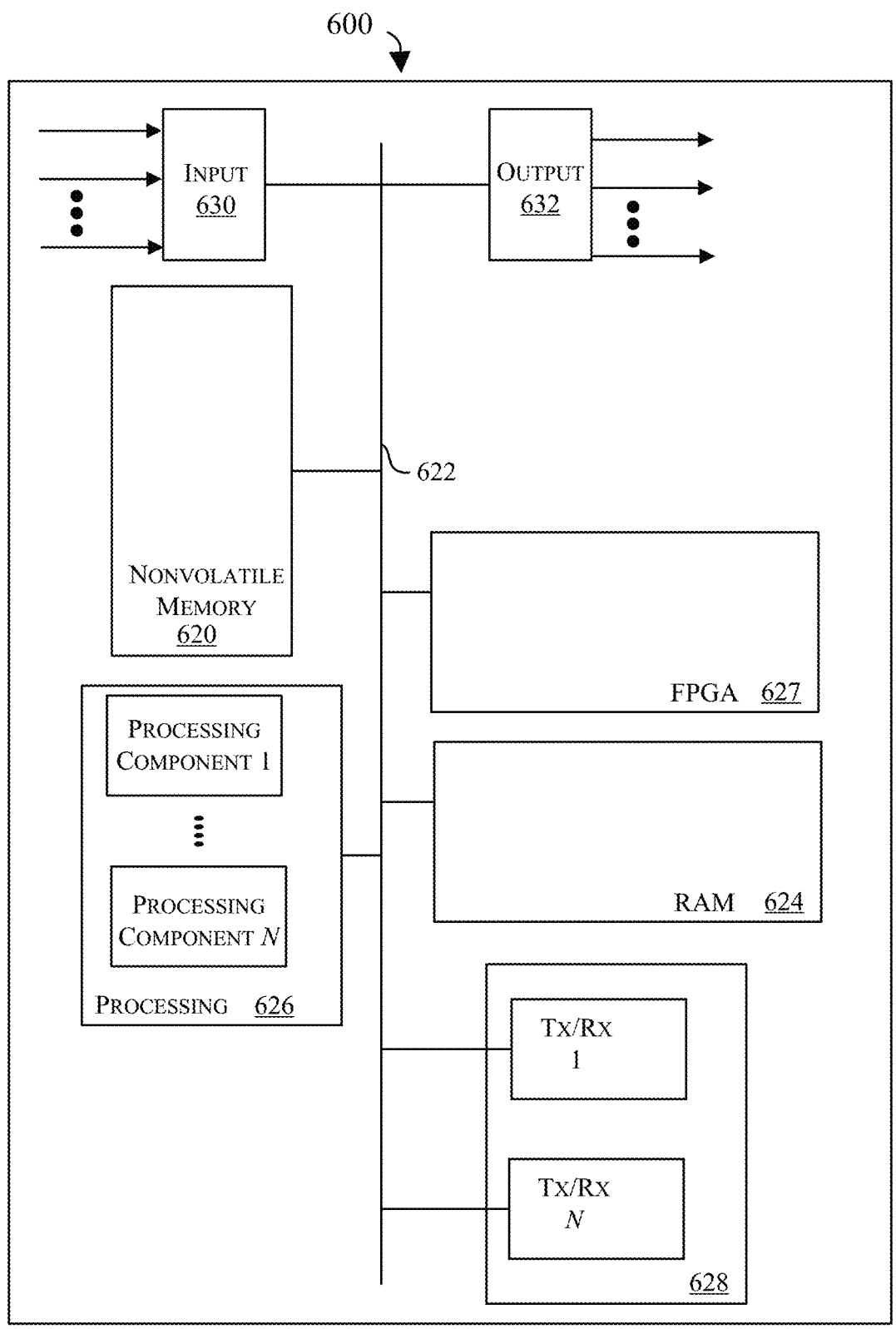
FIG. 6 illustrates a block diagram of a computing implementation that can be used to carry out the functionality of methods and/or components disclosed herein.

The methods described in connection with the embodiments disclosed herein may be embodied directly in hardware, in processor-executable code encoded in a non-transitory tangible processor readable storage medium, or in a combination of the two. Referring to FIG. 6 for example, shown is a block diagram depicting physical components that may be utilized to realize the dynamic setpoint module 110. As shown, in this embodiment nonvolatile memory 620 is coupled to a bus 622 that is also coupled to random access memory ("RAM") 624, a processing portion (which includes N processing components) 626, a field programmable gate array (FPGA) 627, and a transceiver component 628 that includes N transceivers. None of these components are required, and any combination of these may be included in the device 600. For instance, where an FPGA 627 is implemented, the processing portion 626 may not be used, and vice versa. Although the components depicted in FIG. 6 represent physical components, FIG. 6 is not intended to be a detailed hardware diagram; thus, many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

In general, the nonvolatile memory 620 is non-transitory memory that functions to store (e.g., persistently store) data and processor-executable code (including executable code that is associated with effectuating the methods described herein). In some embodiments for example, the nonvolatile memory 620 includes bootloader code, operating system code, file system code, and non-transitory processor-executable code to facilitate the execution of a method to select produce the internal setpoint 105.

In many implementations, the nonvolatile memory 620 is realized by flash memory (e.g., NAND or ONENAND memory), but it is contemplated that other memory types may also be utilized. Although it may be possible to execute the code from the nonvolatile memory 620, the executable code in the nonvolatile memory is typically loaded into RAM 624 and executed by one or more of the N processing components in the processing portion 626.

The N processing components in connection with RAM 624 generally operate to execute the instructions stored in nonvolatile memory 620 to enable a method to generate the internal setpoint 105. For example, non-transitory, processor-executable code to effectuate the method described with reference to FIG. 4 may be persistently stored in nonvolatile memory 620 and executed by the N processing components in connection with RAM 624. As one of ordinarily skill in the art will appreciate, the processing portion 626 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 626 may be configured to effectuate one or more aspects of the methodologies described herein. For example, non-transitory processor-readable instructions may be stored in the nonvolatile memory 620 or in RAM 624 and when executed on the processing portion 626, cause the processing portion 626 to perform functions of the model reference module 320, difference module 326, the setpoint-shaping controller 324, and the summation module 328. Also, non-transitory FPGA-configuration-instructions may be persistently stored in nonvolatile memory 620 and accessed by the processing portion 626 (e.g., during boot up) to configure the FPGA to effectuate the functions of the dynamic average delivered power module 322. Alternatively, the FPGA 627 may include on-board memory, or may access off-chip memory such as the nonvolatile memory 620 accessible via bus 622.

The input component 630 operates to receive signals (e.g., feedback from the sensors 108 and/or user inputs 103 from a user that are indicative of one or more aspects of a target N state waveform or conditions of the nonlinear load 104. The signals received at the input component may include, for example, a measurement of power delivered to a plasma processing chamber. The output component generally operates to provide one or more analog or digital signals to effectuate an operational aspect of the dynamic setpoint module 110. For example, the output portion 632 may provide the internal setpoint signal to the power amplifier 112.

The depicted transceiver component 628 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A generator comprising:
a power amplifier configured to apply output power to a load responsive to an internal power setpoint;
a metrology component configured to produce a dynamic average-delivered-power value based upon instantaneous measurements of the output power; and
a dynamic setpoint module configured to:
receive a setpoint value for each of a plurality of power states; and
within each of the power states:
create a dynamic reference-time response;
compute an error value based upon a difference between the dynamic reference-time response and the dynamic average-delivered-power value;
produce a controller output value based upon the error value; and
produce the internal power setpoint by adding the controller output value and the setpoint value.

2. The generator of claim 1 wherein the metrology component comprises a field programmable gate array and the dynamic setpoint module comprises a processor and processor-executable instructions stored in nonvolatile memory.

3. The generator of claim 1, wherein each setpoint value is a desired average power value.

4. The generator of claim 1, wherein the dynamic setpoint module is configured to receive at least one time value, $t_{ramp}$, that defines a time it takes each of the power states to reach the setpoint value.

5. The generator of claim 1, wherein the metrology component is configured to select a calculation for the average-delivered-power value based upon a pulse repetition period of the output power.

6. A method for controlling a generator, comprising:
receiving a power sequence comprising a plurality of power states;
creating a dynamic reference-time response within each state;
determining a dynamic average-delivered-power value within each state;
calculating an error signal within each state;
producing a controller output using the error signal;
calculating an internal setpoint based upon the error signal; and
controlling a power amplifier using the internal setpoint to control output power.

7. The method of claim 6, comprising:
receiving a desired average power value for each state;
calculating the dynamic average-delivered-power value based upon a desired average power value.

8. The method of claim 7, comprising selecting a calculation for the average-delivered-power value based upon a pulse repetition period of the output power.

9. The method of claim 8 wherein the calculating the dynamic average-delivered-power value comprises calculating the dynamic average-delivered-power value based upon a desired average power value and a time value, tramp, that defines a time it takes each of the power states to reach the setpoint value.

10. The method of claim 6, wherein producing the controller output value comprises producing a proportional-integral-derivative output value based upon the error value.

11. A non-transitory, tangible computer readable storage medium, encoded with processor readable instructions to control a generator, the instructions comprising instructions to:
receive a power sequence comprising a plurality of power states;
create a dynamic reference-time response within each state;
determine a dynamic average-delivered-power value within each state;
calculate an error signal within each state;
produce a controller output using the error signal;
calculate an internal setpoint based upon the error signal; and
control a power amplifier using the internal setpoint to control output power.

12. The non-transitory, tangible computer readable storage medium of claim 11, comprising:
receiving a desired average power value for each state;
calculating the dynamic average-delivered-power value based upon a desired average power value.

13. The non-transitory, tangible computer readable storage medium of claim 12, comprising selecting a calculation for the average-delivered-power value based upon a pulse repetition period of the output power.

14. The non-transitory, tangible computer readable storage medium of claim 13 wherein the calculating the dynamic average-delivered-power value comprises calculating the dynamic average-delivered-power value based upon a desired average power value and a time value, tramp, that defines a time it takes each of the power states to reach the setpoint value.

15. The non-transitory, tangible computer readable storage medium of claim 11, wherein producing the controller output value comprises producing a proportional-integral-derivative output value based upon the error value.

16. The non-transitory, tangible computer readable storage medium of claim 11, wherein the instructions to determine a dynamic average-delivered-power value within each state comprise instructions to program a field programmable gate array to determine a dynamic average-delivered-power value within each state.

* * * * *